(12) United States Patent
Shimada et al.

(10) Patent No.: US 6,351,004 B1
(45) Date of Patent: Feb. 26, 2002

(54) TUNNELING TRANSISTOR APPLICABLE TO NONVOLATILE MEMORY

(75) Inventors: Yasuhiro Shimada, Mukou; Shinichiro Hayashi, Takatsuki, both of (JP); Kiyoshi Uchiyama; Keisuke Tanaka, both of Colorado Springs, CO (US)

(73) Assignee: Matsushita Electric Ind. Co., Ltd., Osaka-fu (JP)

( * ) Notice: Subject to any disclaimer, the term of this patent is extended or adjusted under 35 U.S.C. 154(b) by 0 days.

(21) Appl. No.: 09/688,494

(22) Filed: Oct. 16, 2000

(30) Foreign Application Priority Data

Oct. 21, 1999 (JP) .............................. 11-299679

(51) Int. Cl.[7] .............................. H01L 29/78
(52) U.S. Cl. .................. 257/295; 257/288; 257/296; 257/298
(58) Field of Search ................. 257/295, 405, 257/410, 406, 411, 651, 288, 298, 296

(56) References Cited

U.S. PATENT DOCUMENTS 6,121,654 A  9/2000  Likharev
6,169,308 B1 * 1/2001 Sunami et al.
6,197,668 B1 * 3/2001 Gardner et al.

* cited by examiner

Primary Examiner—Nathan Flynn
Assistant Examiner—Kevin Quinto
(74) Attorney, Agent, or Firm—Price and Gess (57) ABSTRACT

A tunneling transistor is provided as an effective means for miniaturization of a semiconductor integrated circuit having nonvolatile memory. An insulating layer is disposed on a silicon substrate. A source and a drain are disposed on the insulating layer, with an insulator of a few nanometers in thickness that provides a tunnel barrier being interposed between the source and the drain. A ferroelectric layer that exhibits spontaneous polarization is disposed directly above a region of the source that is adjacent to the insulator. With this construction, when the ferroelectric layer is polarized in a predetermined direction, at least a portion of the region of the source adjacent to the insulator forms a depletion region, with it being possible to vary the amount of current tunneling through the insulator depending on whether the ferroelectric layer is polarized or not.

13 Claims, 7 Drawing Sheets

TUNNELING TRANSISTOR APPLICABLE TO NONVOLATILE MEMORY

This application is based on an application No. H11-299679 filed in Japan, the content of which is hereby incorporated by reference.

BACKGROUND OF THE INVENTION

1. Field of the Invention

The present invention relates to a tunneling transistor that is applicable to nonvolatile memory.

2. Related Art

A MOSFET (Metal-Oxide-Semiconductor Field-Effect Transistor), in which a thin oxide insulating film is deposited on a semiconductor substrate and a gate electrode is provided on the insulating film, operates as a transistor based on the principle that a current flowing through a semiconductor channel between a source and a drain located beneath the gate electrode is modulated by a voltage ("gate voltage") applied to the gate electrode. However, as the length of the channel gets closer to 10 nm due to miniaturization of the transistor, a problem known as "short-channel effects" arises, which makes it impossible to control the amount of current passing through the channel by the gate voltage. To overcome this problem while reducing the channel length, a tunneling transistor has been devised which, having formed a channel from a material such as an insulator that provides a tunnel barrier, controls the amount of current flowing through the channel by varying the barrier potential of the insulator (see E.S. Snow et al. *Applied Physics Letters*, vol. 72, pp. 3071–3073 (1998)).

However, such a tunneling transistor does not possess a memory function, and therefore is not applicable for miniaturization of semiconductor integrated circuits having memory circuits.

SUMMARY OF THE INVENTION

The present invention aims to provide an effective means that fosters miniaturization of a semiconductor integrated circuit having nonvolatile memory.

This object can be achieved by a tunneling transistor having a source, a drain, and a gate, including: a tunnel barrier layer which forms a tunnel barrier between the source and the drain; and a ferroelectric layer which exhibits spontaneous polarization, wherein when the ferroelectric layer is polarized in a predetermined direction, the polarization induces formation of a depletion region within a region of the source that is adjacent to the tunnel barrier layer.

With this construction, storing of data is performed by exploiting the phenomenon in which a current tunneling through the tunnel barrier layer provided as the channel between the source and the drain varies due to spontaneous polarization of the ferroelectric layer. Since the tunnel barrier layer is generally made of a material such as an ultrathin insulator, the length of the channel can be reduced, which benefits miniaturization of a semiconductor integrated circuit having nonvolatile memory.

BRIEF DESCRIPTION OF THE DRAWINGS

These and other objects, advantages and features of the invention will become apparent from the following description thereof taken in conjunction with the accompanying drawings that illustrate a specific embodiment of the invention. In the drawings.

DESCRIPTION OF THE PREFERRED EMBODIMENT(S)

The following is a description of embodiments of the present invention with reference to the figures.

First Embodiment

Figure 1:
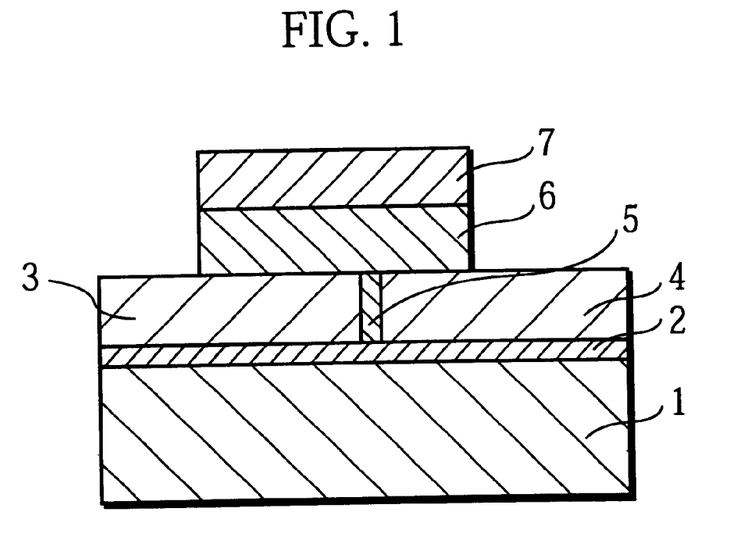
FIG. 1 is a schematic sectional view showing the construction of a tunneling transistor according to the first embodiment of the invention.

FIG. 1 is a schematic sectional view showing the construction of a tunneling transistor according to the first embodiment of the invention. In the figure, a first insulating layer 2 made of a silicon oxide ($SiO_2$) or the like is formed on a silicon substrate 1. A source 3 made of n-type silicon and a drain 4 made of n-type silicon are formed on the first insulating layer 2, with an insulator 5 that provides a tunnel barrier being interposed between the source 3 and the drain 4. This insulator 5 is made of a silicon oxide ($SiO_2$) or the like. A ferroelectric layer 6 is formed on top of the source 3, insulator 5, and drain 4. A gate electrode 7 is disposed on the ferroelectric layer 6.

In this embodiment, the ferroelectric layer 6 is positioned immediately above the source 3 and the drain 4. To prevent n-type silicon which constitutes the source 3 and the drain 4 from being oxidized and thereby becoming an insulator, a ferroelectric material of low oxidizing power such as $BaF_4$ is used as the ferroelectric layer 6. Alternatively, if MOCVD (Metal-Organic Chemical Vapor Deposition) that dissolves a ferroelectric material in an organic solvent and spreads on and fires the dissolved substance is employed, a material such as $SrBi_2Ta_2O_9$ or $PZT(Pb(Zr_{1-x}Ti_x) O_3)$ (a registered trademark of Kabushiki Kaisha Toshiba) may be used as the ferroelectric layer 6. The gate electrode 7 is made of platinum (Pt), iridium (Ir), iridium oxide ($IrO_2$), ruthenium oxide ($RuO_2$) polysilicon, or the like.

Though the source 3 and the drain 4 are made of n-type silicon in this embodiment, they may instead be made of p-type silicon or a semiconductor material other than silicon. Likewise, the first insulating layer 2 and the insulator 5 may be made of a material selected from a variety of insulating materials other than $SiO_2$.

The above constructed tunneling transistor operates on the following principle.

Figure 2A:
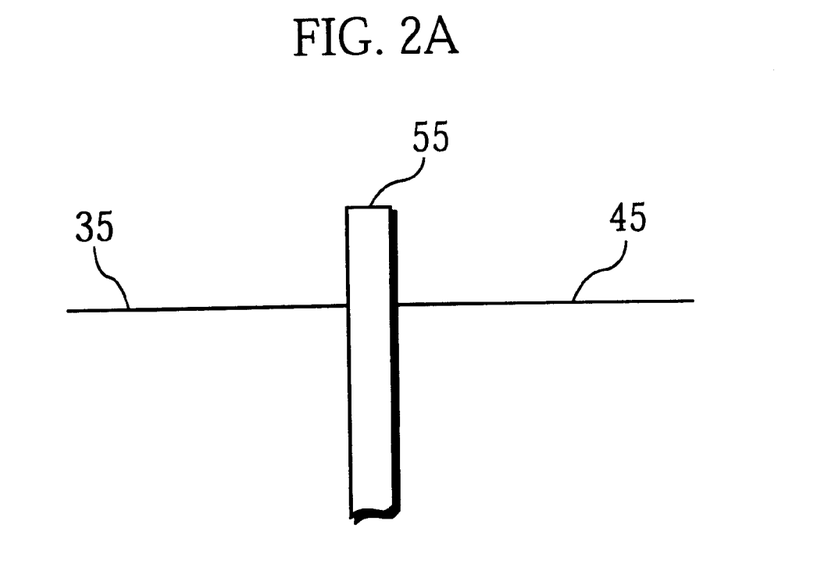
FIGS. 2A and 2B are energy band diagrams of the tunneling transistor when there is no depletion region in a source and a drain.
Figure 2B:
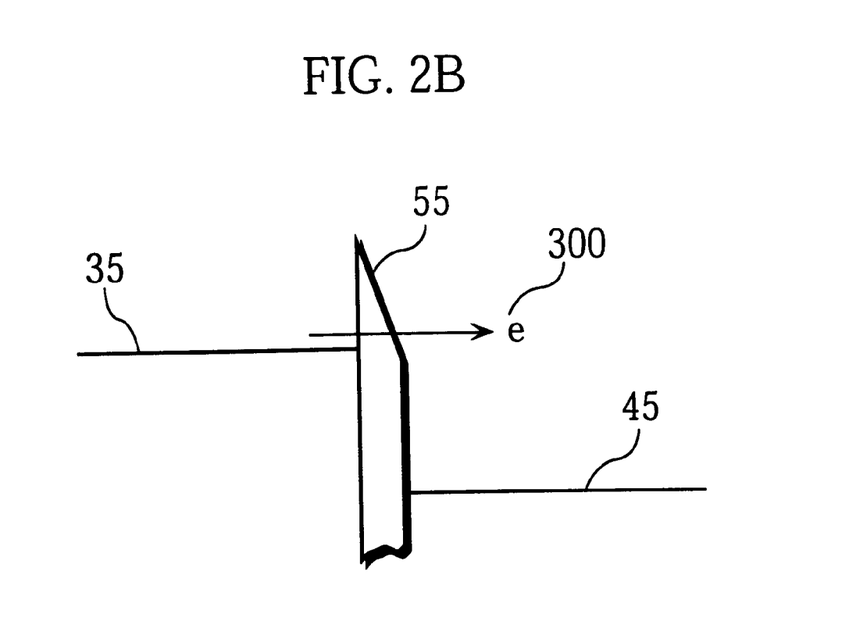

Once the source 3 and the drain 4 have been grounded, the source 3, the drain 4, and the insulator 5 assume a state of thermal equilibrium. FIG. 2 shows the state of the energy band of the tunneling transistor when no depletion region is formed in the source 3 and the drain 4. FIG. 2A is an energy band diagram of the tunneling transistor under thermal equilibrium. In the figure, reference numeral 35 denotes the potential at the conduction band edge of the source 3, reference numeral 45 denotes the potential at the conduction band edge of the drain 4, and reference numeral 55 denotes the barrier potential of the insulator 5. This being so, when a positive bias is applied to the drain 4, a large electric field is directed towards the insulator 5, which causes a reduction in the potential 45 at the conduction band edge of the drain 4 as shown in FIG. 2B. This reduction of the potential 45 induces a drop of the barrier potential 55 of the insulator 5, thereby allowing electrons 300 to tunnel through the insulator 5 from the source 3 to the drain 4.

Figure 3:
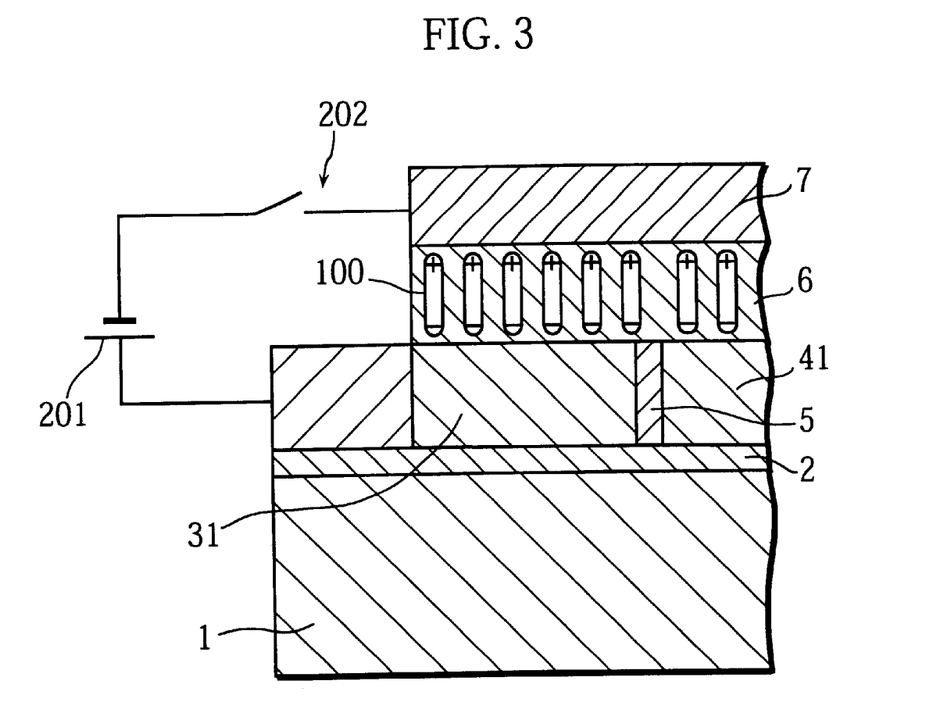
FIG. 3 illustrates the polarization of a ferroelectric and the formation of depletion regions induced by application of a gate bias.

Here, if a negative bias against the source 3 is applied to the gate electrode 7 through a dc power supply 201 before the application of the bias to the drain 4 so as to induce upward polarization of the ferroelectric 6 as shown in FIG. 3, part of the source 3 and drain 4 that is affected by this polarization ionizes positively and as a result forms depletion regions 31 and 41. Note here that the depletion regions 31 and 41 show so-called "complete depletion" in FIG. 3.

Which is to say, stimulated by negative charges at the end of the polarization 100 of the ferroelectric 6 that has been induced by the application of the negative gate bias, a positively depleted region 31 and a positively depleted region 41 are created respectively within the source 3 and the drain 4 beneath the ferroelectric layer 6. This being the case, even after the gate bias is removed by toggling a switch 202 off, the polarization 100 will remain because the ferroelectric layer 6 is made of a material that exhibits spontaneous polarization. Hence the depletion regions 31 and 41 will be maintained, too.

Figure 4A:
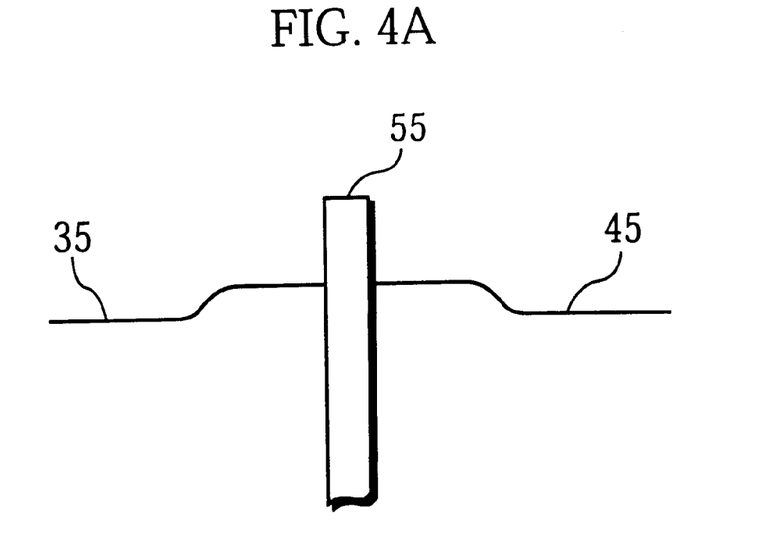
FIGS. 4A and 4B are energy band diagrams of the tunneling transistor when there are depletion regions in the source and the drain.
Figure 4B:
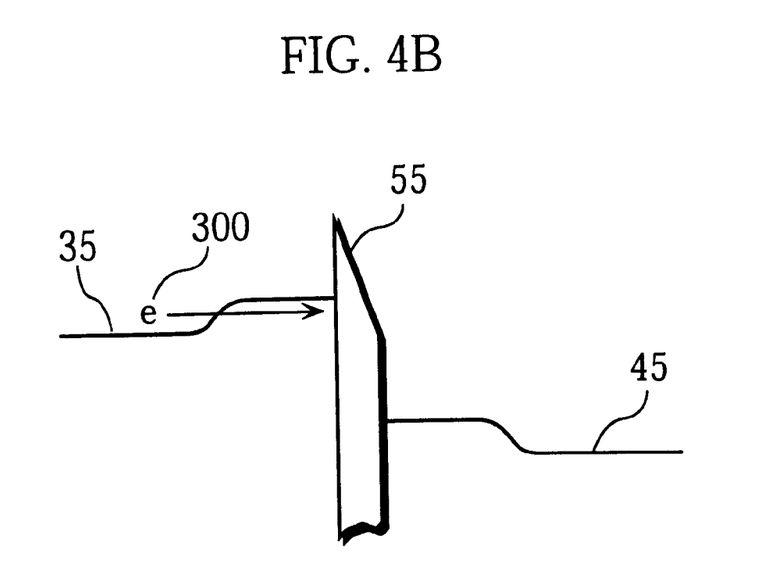

FIG. 4A is an energy band diagram for this state of the tunneling transistor. As illustrated, the potentials 35 and 45 are raised in the vicinity of the barrier potential 55 of the insulator 5.

This being so, when a bias is applied to the drain 4, a large electric field is directed towards the insulator 5. However, since the potential 35 is raised in the vicinity of the insulator 5 due to the presence of the depletion region 31, the effective thickness of the tunnel barrier is increased. Therefore, the probability that the electrons 300 will tunnel through the insulator 5 from the source 3 to the drain 4 is low.

Thus, the amount of tunneling current flowing from the source 3 to the drain 4 differs between the case where the ferroelectric layer 6 is upward polarized and the case where the ferroelectric layer 6 is not upward polarized. That is, the amount of tunneling current is small while the ferroelectric layer 6 is polarized, whereas the amount of tunneling current is large while the ferroelectric layer 6 is not polarized. Accordingly, by detecting the amount of tunneling current between the source 3 and the drain 4, it is possible to judge whether the ferroelectric layer 6 maintains polarization or not. Since the ferroelectric layer 6 is made of a material that exhibits spontaneous polarization, the polarization state is maintained even after the gate bias is removed. This phenomenon can be exploited to realize the function of nonvolatile memory, where detecting the amount of tunneling current is analogous to reading data from memory.

Conversely, writing data into memory is analogous to polarizing the ferroelectric layer 6, so that this can be done by applying a predetermined amount of bias to the gate electrode 7 as explained above. Also, erasing data from memory can be done by applying a reverse bias of that applied at the time of writing to the gate electrode 7, thereby clearing or inverting the polarization state in the ferroelectric layer 6.

In actual use of this tunneling transistor as nonvolatile memory, a tunneling current flowing between the source 3 and the drain 4 may be amplified through the use of a sense amplifier or the like. In so doing, the tunneling transistor can be used in the same way as nonvolatile memory such as a conventional EEPROM (Electrically Erasable and Programmable ROM).

In the above embodiment, the ferroelectric layer 6 is formed on top of the source 3, insulator 5, and drain 4. However, given that the tunneling transistor of the invention serves to vary the amount of tunneling current emitted from the source 3, the formation of the ferroelectric layer 6 can be modified as long as it induces such a change of the potential 35 that varies the amount of tunneling current within a detectable range in a region of the source 3 that is adjacent to the insulator 5.

Also, while n-type silicon constituting the source 3 is completely depleted in the region of the source 3 that is adjacent to the insulator 5 in the above embodiment, such complete depletion is not necessarily required, as long as it induces such a change of the potential 35 that allows a change in tunneling current amount caused by polarization of the ferroelectric layer 6 to be detected.

In the above embodiment, no mention is made of the values of parameters such as the gate bias. This is because these parameters should be optimized depending on what types of materials are selected for the source 3, the drain 4, the insulator 5, the ferroelectric layer 6, and so on. Likewise, these parameters should be optimized depending on the extent of change in tunneling current amount resulting from the use of the selected materials, as well as the circuit construction for detecting such a change. With the above embodiment, nevertheless, by adjusting the gate bias it is possible to control the amount of tunneling current in accordance with the circuit construction used for detecting variations in tunneling current, since the height of the barrier potential of the insulator 5 can be controlled by controlling the gate bias.

Second Embodiment

Figure 5:
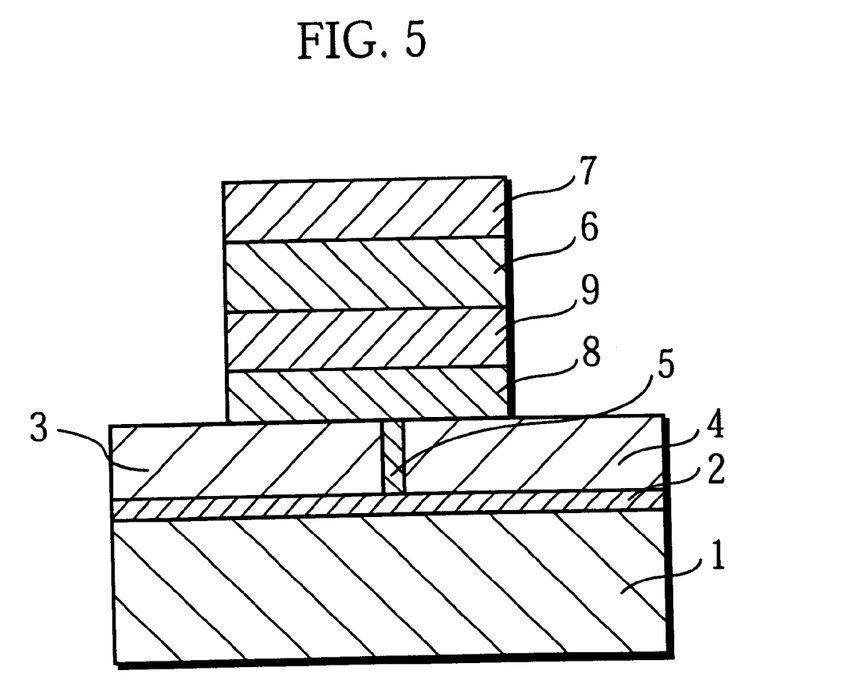
FIG. 5 is a schematic sectional view showing the construction of a tunneling transistor according to the second embodiment of the invention.

FIG. 5 is a schematic sectional view showing the construction of a tunneling transistor according to the second embodiment of the invention. As shown in the figure, this tunneling transistor differs with the first embodiment in that a second insulating layer 8 and a floating electrode 9 are interposed between the source 3, the insulator 5, and the drain 4 on one side and the ferroelectric layer 6 on the other side. The following explanation focuses on the difference with the first embodiment.

The floating electrode 9 is provided to keep the ferroelectric layer 6 from direct contact with the source 3 and the drain 4. As mentioned earlier, when the ferroelectric layer 6 is made of an oxide, part of the surfaces of the source 3 and drain 4 that comes into contact with the ferroelectric layer 6 may be oxidized, thereby forming a thin insulator. Besides, the composition of the ferroelectric 6 changes during the growth of crystals, causing unstable growth of the ferroelectric crystals. Although it is explained in the first embodiment that the use of an oxide is possible if MOCVD is employed, in the second embodiment the floating electrode 9 is introduced to help stable growth of the ferroelectric crystalline material. As for the second insulating layer 8, a material such as $SiO_2$, $SrTa_2O_6$, $SeO_2$, or $SrTiO_3$ is applicable.

The ferroelectric layer 6 and the second insulating layer 8 are equivalent to two capacitors in series. Accordingly, if the permittivity of the second insulating layer 8 is much lower than that of the ferroelectric layer 6, a voltage applied to the ferroelectric layer 6 decreases, as a result of which clearing or inverting a polarization state of the ferroelectric layer 6 may become impossible. Therefore, it is preferable to choose a material of high permittivity such as $SrTa_2O_6$ or $SrTiO_3$ or a nonoxide material such as SiN for the second insulating layer 8.

As for the floating electrode 9, a substance such as platinum (Pt), iridium (Ir), iridium oxide ($IrO_2$), ruthenium oxide ($RuO_2$), or polysilicon may be used.

Third Embodiment

In the first and second embodiments, the tunneling transistor is constructed such that the insulator 5 of a few nanometers in thickness through which a tunneling current flows is formed between the source 3 and the drain 4. Such a construction, though applicable when fabricating a small number of semiconductor devices, may not be suitable for fabrication of a large number of identical semiconductor devices in an integrated circuit. Considering this, the third embodiment presents a construction that lends itself to fabrication of a substantial number of semiconductor devices on a single substrate.

Figure 6:
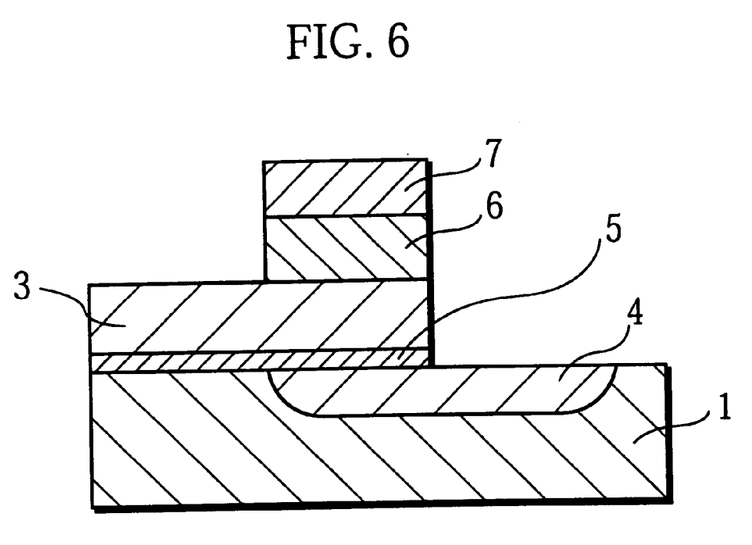
FIG. 6 is a schematic sectional view showing the construction of a tunneling transistor according to the third embodiment of the invention.

FIG. 6 is a schematic sectional view showing the construction of a tunneling transistor according to the third embodiment of the invention. As illustrated, the drain 4 made of n-type silicon is formed on the silicon substrate 1, and the insulator 5 made of a silicon oxide ($SiO_2$) is deposited on the silicon substrate 1 and the drain 4. The source 3 made of n-type silicon is formed on the insulator 5, and the ferroelectric layer 6 and the gate 7 are formed on the source 3 in this order.

This tunneling transistor operates on the same principle as that in the first embodiment. More specifically, once the source 3 and the drain 4 have been grounded, the source 3, the drain 4, and the insulator 5 assume a state of thermal equilibrium. The state of the energy band at this point is as shown in FIG. 2.

This being so, when a positive bias is applied to the drain 4, an electric field is directed towards the insulator 5, as a result of which the tunneling electrons 300 are emitted from the source 3 to the drain 4.

Here, if a negative bias against the source 3 is applied to the gate 7 before the application of the bias to the drain 4 so as to induce upward polarization of the ferroelectric layer 6, part of the source 3 directly underneath the ferroelectric layer 6 is positively ionized and thereby forms a depletion region. This depletion region of the source 3 is maintained even after the gate bias is removed, since the ferroelectric layer 6 is made of a material that exhibits spontaneous polarization.

Next, when a positive bias is applied to the drain 4 while the depletion region of the source 3 is maintained, a large electric field is directed towards the insulator 5, but the probability of the electrons 300 tunneling through the insulator 5 from the source 3 to the drain 4 is low because the effective thickness of the tunnel barrier is increased due to the potential generated by the depletion region of the source 3. Therefore, by detecting the amount of tunneling current flowing from the source 3 to the drain 4, it is possible to judge whether the ferroelectric layer 6 maintains polarization in a predetermined direction, as in the first embodiment. This phenomenon can be exploited to realize the function of nonvolatile memory.

Note that though it is not imperative for the entire part of the source 3 directly underneath the ferroelectric layer 6 to be completely depleted, it is desirable that at least some part of the depletion region induced by the spontaneous polarization of the ferroelectric layer 6 be in contact with the insulator 5.

Figure 7:
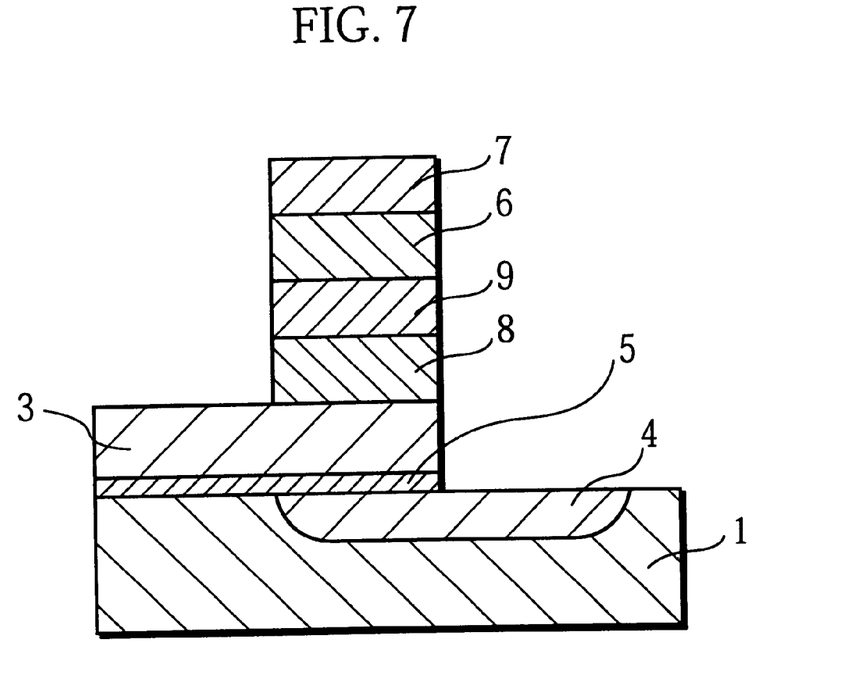
FIG. 7 is a schematic sectional view showing the construction of a variant of the tunneling transistor of the third embodiment.

Also, the second insulating layer 8 and the floating electrode 9 presented in the second embodiment may be incorporated in the tunneling transistor of the third embodiment, as shown in FIG. 7.

Modifications

Though the present invention has been described based on the foregoing embodiments, the invention should not be limited to such. For example, the following modification is possible.

In the above embodiments, a thin film of a silicon oxide ($SiO_2$) that is an insulating material is provided as the insulator 5. However, given that the insulator 5 acts as the tunnel barrier, not only an insulating material but also other material is adaptable for use as the insulator 5, as long as a tunneling current can flow from the source 3 to the drain 4 and a change in tunneling current caused by an increase in potential of the conduction band edge of the source 3 can be detected.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A tunneling transistor having a source, a drain, and a gate, comprising:

a tunnel barrier layer which forms a tunnel barrier between the source and the drain; and a ferroelectric layer which exhibits spontaneous polarization, wherein when the ferroelectric layer is polarized in a predetermined direction, the polarization induces formation of a depletion region within a region of the source that is adjacent to the tunnel barrier layer.

2. The tunneling transistor of claim 1, wherein the ferroelectric layer is interposed between the gate and the tunnel barrier layer, and the polarization of the ferroelectric layer is caused by an application of a predetermined bias to the gate.

3. The tunneling transistor of claim 2, wherein the polarization of the ferroelectric layer induces complete depletion of the region of the source that is adjacent to the tunnel barrier layer.

4. The tunneling transistor of claim 1, wherein the tunnel barrier layer is formed by interposing an insulating material between the source and the drain.

5. The tunneling transistor of claim 4, wherein the source and the drain are made of a material selected from the group consisting of n-type silicon and p-type silicon, and the tunnel barrier layer is made of a silicon oxide.

6. The tunneling transistor of claim 2, wherein the source and the drain are disposed adjacent to each other on a single substrate, the tunnel barrier layer is interposed between the source and the drain, and the ferroelectric layer and the gate are disposed in the stated order on the source, the tunnel barrier layer, and the drain.

7. The tunneling transistor of claim 2, wherein the drain is disposed on a substrate, the tunnel barrier layer and the source are disposed in the stated order on the drain, and the ferroelectric layer and the gate are disposed, in the stated order, on part of an upper surface of the source which corresponds to part of a lower surface of the tunnel barrier layer that is in contact with the drain.

8. The tunneling transistor of claim 2, further comprising:

a floating electrode which is disposed adjacent to a surface of the ferroelectric layer on the side of the tunnel barrier layer; and an insulating layer which is disposed adjacent to a surface of the floating electrode on the side of the tunnel barrier layer.

9. The tunneling transistor of claim 8, wherein the insulating layer has a permittivity such that a predetermined voltage is applied to the ferroelectric layer when the predetermined bias is applied to the gate.

10. The tunneling transistor of claim 9, wherein the ferroelectric layer is made of at least one material selected from the group consisting of $SrBi_2Ta_2O_9$ and $PZT(Pb(Zr_{1-x}Ti_x)O_3)$, and the insulating layer is made of a material selected from the group consisting of $SrTa_2O_6$ and $SrTiO_3$.

11. The tunneling transistor of claim 10, wherein the ferroelectric layer is formed by growing crystals on the floating electrode.

12. The tunneling transistor of claim 8, wherein the drain is disposed on a substrate, the tunnel barrier layer and the source are disposed in the stated order on the drain, and the insulating layer, the floating electrode, the ferroelectric layer, and the gate are disposed, in the stated order, on part of an upper surface of the source which corresponds to part of a lower surface of the tunnel barrier layer that is in contact with the drain.

13. The tunneling transistor of claim 2, wherein a barrier potential of the tunnel barrier layer is controlled by a level of a bias applied to the gate.

* * * * *